US010860758B2

(12) United States Patent
Liu et al.

(10) Patent No.: US 10,860,758 B2
(45) Date of Patent: Dec. 8, 2020

(54) METHOD OF USING SIMULATION SOFTWARE TO GENERATE CIRCUIT LAYOUT

(71) Applicant: Realtek Semiconductor Corp., HsinChu (TW)

(72) Inventors: Chien-Cheng Liu, Hsinchu County (TW); Shih-Chih Liu, Hsinchu County (TW); Yun-Chih Chang, Hsinchu County (TW); Shu-Yi Kao, Hsinchu County (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 16/667,925

(22) Filed: Oct. 30, 2019

(65) Prior Publication Data
US 2020/0334339 A1 Oct. 22, 2020

(30) Foreign Application Priority Data
Apr. 22, 2019 (TW) .............................. 108113998 A

(51) Int. Cl.
G06F 30/30 (2020.01)
G06F 30/33 (2020.01)
G06F 30/392 (2020.01)
G06F 30/398 (2020.01)

(52) U.S. Cl.
CPC .............. *G06F 30/30* (2020.01); *G06F 30/33* (2020.01); *G06F 30/392* (2020.01); *G06F 30/398* (2020.01)

(58) Field of Classification Search
CPC ....... G06F 30/392; G06F 30/33; G06F 30/398
USPC .......................................... 716/118, 119, 122
See application file for complete search history.

(56) References Cited

U.S. PATENT DOCUMENTS

| 7,886,248 | B2 * | 2/2011 | Hirota | G06F 30/39 716/130 |
| 7,926,017 | B2 * | 4/2011 | Chang et al. | G06F 30/398 716/122 |
| 8,769,476 | B2 * | 7/2014 | Lee et al. | G06F 30/39 716/139 |
| 9,064,938 | B2 * | 6/2015 | Etherton et al. | H01L 27/0296 |
| 9,779,203 | B2 * | 10/2017 | Donnelly | G06F 30/367 |
| 9,852,245 | B2 * | 12/2017 | Kusko et al. | G06F 30/3323 |
| 10,109,621 | B2 * | 10/2018 | Lee | H01L 29/0653 |
| 2019/0392109 | A1 * | 12/2019 | Liu et al. | G06F 30/392 |

* cited by examiner

*Primary Examiner* — Sun J Lin
(74) *Attorney, Agent, or Firm* — Winston Hsu

(57) ABSTRACT

A method of using a simulation software to generate a circuit layout, the method comprising: (A) determining a plurality of blocks on a circuit board, wherein each block of the plurality of blocks includes an operating space and a reserved space; (B) determining a size of the reserved space of each block of the plurality of blocks according to at least one specific condition;(C) determining whether to adjust the size of the reserved space of each block of the plurality of blocks according to at least one determining condition; and (D) when it is determined not to adjust the size of the reserved space in step (C), generating the circuit layout according to the size of the reserved space of each block of the plurality of blocks determined in step (B).

18 Claims, 5 Drawing Sheets

| FFG1 | Cell(n) | Cell(n-1) | Cell(n-2) | Cell(n-3) | DCAP16 |
|---|---|---|---|---|---|
| FFG2 | Cell(n-4) | Cell(n-5) | Cell(n-6) | Cell(n-7) | DCAP8 |
| FFG3 | Cell(n-8) | Cell(n-8) | Cell(n-10) | Cell(n-11) | DCAP4 |
| FFG4 | Cell(n-12) | Cell(n-13) | Cell(n-14) | Cell(n-15) | DCAP2 |
| FFG5 | Cell(n-16) | Cell(n-17) | Cell(n-18) | Cell(n-19) | |
| FFG6 | Cell(n-20) | Cell(n-21) | Cell(n-22) | Cell(n-23) | |
| FFG7 | Cell(n-24) | Cell(n-25) | Cell(n-26) | Cell(n-27) | |
| FFG8 | Cell(n-28) | Cell(n-29) | Cell(n-30) | Cell(n-31) | |

FIG. 3

METHOD OF USING SIMULATION SOFTWARE TO GENERATE CIRCUIT LAYOUT

BACKGROUND OF THE INVENTION

1. Field of the Invention

The present invention relates to an application of power integrity (PI), more particularly, to a method for properly determining a circuit layout to solve the problem that the circuit cannot function normally.

2. Description of the Prior Art

When considering the problem of voltage decay (also referred to as the IR drop), for a circuit layout, such as a printed circuit board (PCB) layout, some space between components is usually reserved for placing capacitors (such operation is also called decoupling capacitor (DCAP)) as a solution for solving the problem of circuit functioning abnormally. The aforementioned IR drop can be static IR drop or dynamic IR drop. The static IR drop is mainly related to the structure and connection details of the power network. The effect of resistors is a main concern of the static IR drop. Therefore, for the static IR drop, only the effect of resistors is to be analyzed. The dynamic IR drop is a voltage drop caused by current fluctuations and generated when the power supply is switched. This phenomenon occurs at the triggering edge of the clock, at which surge current is often generated on the entire chip in a short time, and the IR drop phenomenon is induced by the instantaneous surge current. The more the number of transistors that are switched at the same time, the easier the IR drop phenomenon will be induced.

However, the prior art lacks a proper mechanism to determine how much space between components should be reserved to place the capacitor. For example, a present mechanism simply tries to find out available space from the existing space for placing the capacitors and does not consider the toggle rate of the circuit. Referring to FIG. 1, FIG. 1 is a schematic diagram illustrating an exemplary circuit layout which reserves some space for the DCAP in the prior art. In the prior art method, the reserved space is randomly determined or predicted based on previous experience, which is actually inefficient for lessening the occurrence of IR drop. For example, if some areas have been fully placed with electronic components (that is, the space usage of these areas is high), no enough space is left for pacing the DCAP with higher capacitance (where the capacitance is proportional to the volume of the capacitor) for suppressing the dynamic IR drop. However, the toggle rate is usually high in the areas that have been fully placed with electronic components. For example, the areas that have been fully placed with electronic components may the hotspots close to the CPU, the GPU and the DDR memory (such as the circled area in FIG. 1). On the contrary, in some open area with low placement density of the electronic components, there is ample space for placing DCAP. However, the toggle rate is usually low in such area.

In view of this, the prior art method is actually inefficient for determining a circuit layout that can prevent the IR drop from occurring. In this manner, the circuit performance will be degraded and the circuit cost will be greatly increased.

SUMMARY OF THE INVENTION

In view of the conventional circuit design which does not consider the influence of the toggle rate on circuit planning, a method for determining the size of the space reserved for DCAP according to the toggle rate is proposed. By using the software to analyze information, a proper solution for DCAP space is determined. In this manner, the dynamic IR drop can be reduced and the circuit placement can be optimized.

According to one embodiment, a method of using simulation software to generate circuit layout includes: (A) determining a plurality of blocks on a circuit board, wherein each block includes an operating space and a reserved space; (B) determining a size of the reserved space of each of the blocks according to at least one specific condition; (C) determining whether to adjust the size of the reserved space of the blocks determined in step (B) according to at least one determining condition; and (D) when it is determined not to adjust the size of the reserved space in step (C), generating the circuit layout according to the size of the reserved space of the blocks determined in step (B).

According to another embodiment, a method of using simulation software to generate circuit layout includes: (A) providing toggle rate of each area on a circuit board; (B) sorting a plurality of blocks on the circuit board and configuring reserved space of each of the blocks according to the toggle rate of the corresponding block; (C) generating a candidate circuit layout according to the size of the reserved space of the each block; (D) determining whether a total area of the reserved space exceeds a predefined percentage of a total area of the blocks; (E) determining whether an overall dynamic IR drop reaches a predefined target when the total area of the reserved space does not exceed the predefined percentage of the total area of the blocks; and (F) generating the circuit layout according to the candidate circuit layout generated in step (C) when the overall dynamic IR drop reaches the predefined target.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 is an exemplary block classification table generated according to the toggle rates.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should not be interpreted as a close-ended term such as "consist of". Also, the term "couple" is intended to mean either an indirect or direct electrical connection. Accordingly, if one device is coupled to another device, that connection may be through a direct electrical connection, or through an indirect electrical connection via other devices and connections.

Figure 2:
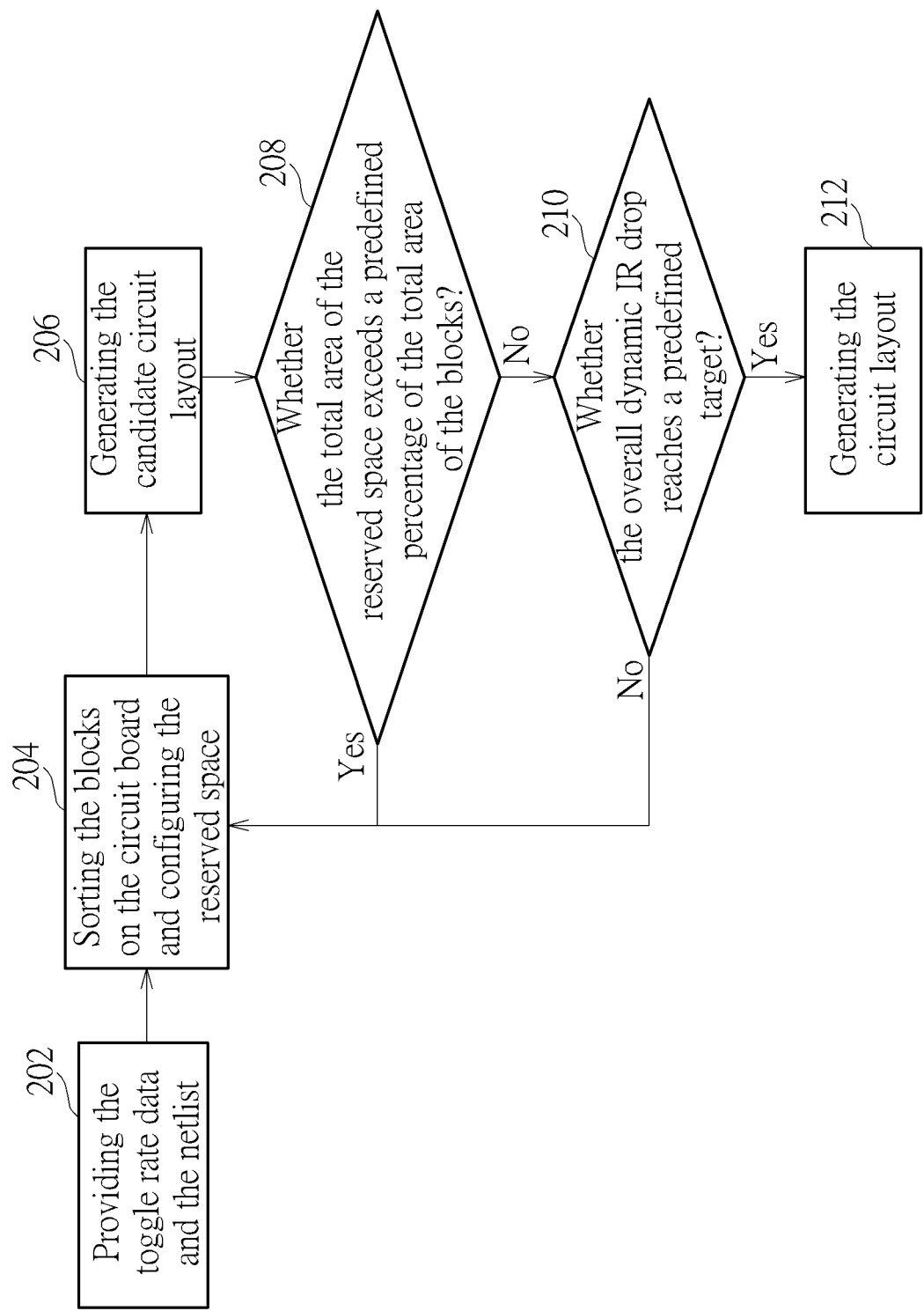
FIG. 2 is a block diagram for generating circuit layout according to an embodiment of the present invention.

Referring to FIG. 2, FIG. 2 is a block diagram for generating circuit layout according to an embodiment of the present invention. First of all, in step 202, toggle rate data (which can be collected as a toggle rate data sheet) of each area on the circuit board is provided to simulation software. In the embodiments of the invention, the simulation software may comprise a plurality of program codes, and may be stored in or loaded to a memory device and executed by a processor (for example, a central processing unit (CPU) or a microprocessor (MCU)) when performing the function of generating circuit layout. In step 204, an initial block placement solution is generated by the processor executing the simulation software according to the collected toggle rate data and the netlist information. At this time, a plurality of blocks on the circuit board are determined by the processor, where each block comprises an operating space for placing electronic components and a reserved space for DCAP. An access rate of each block can be obtained from the toggle rate data sheet.

Regarding step 204, reference may be made to FIG. 3. FIG. 3 is an exemplary block classification table generated according to the toggle rates. For the blocks cell(n), cell(n-1), cell(n-2) and cell(n-3) that have been classified into the group FFG1 may have the highest toggle rate. Therefore, the DCAP parameter is set to DCAP16 (where the greater value is labeled with the term 'DCAP', the larger space can be reserved for placing the capacitors). For example, the space reserved for the blocks with DCAP parameter set to DCAP8 will be smaller than the blocks with DCAP parameter set to DCAP16, the space reserved for the blocks with DCAP parameter set to DCAP4 will be smaller than the blocks with DCAP parameter set to DCAP8, and so on. It should be noted that although placing the capacitors is utilized as the solution for solving the IR drop problem, the invention should not be limited thereto. As long as the same result of lessening the occurrence of IR drop can be achieved, the capacitors can be replaced by any passive device.

In FIG. 3, the dotted line in the middle is utilized to indicate that currently there are four groups FFG1~FFG4 being used. When the finer grouping is required, the dotted line can be pulled down. For example, when the dotted line is moved down one column, the grouping of the blocks becomes 5 groups. For not making the total area occupied by the reserved space in all blocks to become too large, the trade-off between the size of reserved space and the number of grouping (that is, down to where should the dotted line be moved) is a matter to be considered. It should be noted that the software functions (such as sdc and floorplan) can be further utilized to optimize the placement of the electronic components, so as to facilitate generation of the candidate circuit layout.

In the embodiment illustrated above, the blocks are sorted based on the corresponding toggle rates of the blocks, wherein the size of a reserved space assigned to a block is proportional to the toggle rate of that block. That is, for the area which may have higher toggle rate, the larger DCAP area will be assigned. In addition, whether a block is located in a hotspot or is adjacent to a hotspot can also become a consideration in the present invention. For example, a distance between each block and a hotspot may be measured and considered by the processor when determining size of the reserved space (configuring the reserved space). For another example, whether a block is located in a hotspot or is adjacent to a hotspot may also be considered by the processor when determining size of the reserved space (configuring the reserved space).

Based on the block placement and reserved space of each block determined by the processor in step 204, a candidate circuit layout is generated by the processor in step 206.

In order to use the redundant circuit area as much as possible for the DCAP, and also considering not occupying the space for placing important electronic components when the DCAP is introduced, in step 208, another determining condition of "the area of the DCAP space does not occupy 1%~3% (for example, 2%) of the total area of the blocks" may also be used. This is because when the reserved DCAP space is too large, the efficiency of the overall circuit will be affected. When it is determined that the total area of the reserved DCAP space exceeds a predefined value (or a predefined percentage) of the total area of the blocks, step 204 and 206 are returned (re-performed) for the processor to re-generate the candidate circuit layout.

Next, in step 210, the candidate circuit layout is reviewed by the processor. When the size of the DCAP space for the corresponding block is sufficient to make an overall dynamic IR drop to reach a predefined target, the current candidate circuit layout will be the final output layout. In an embodiment of the present invention, the predefined target may be set to the range that the circuit layout is able to maintain a normal functioning state and function normally, but the invention should not be limited thereto.

Figure 1:
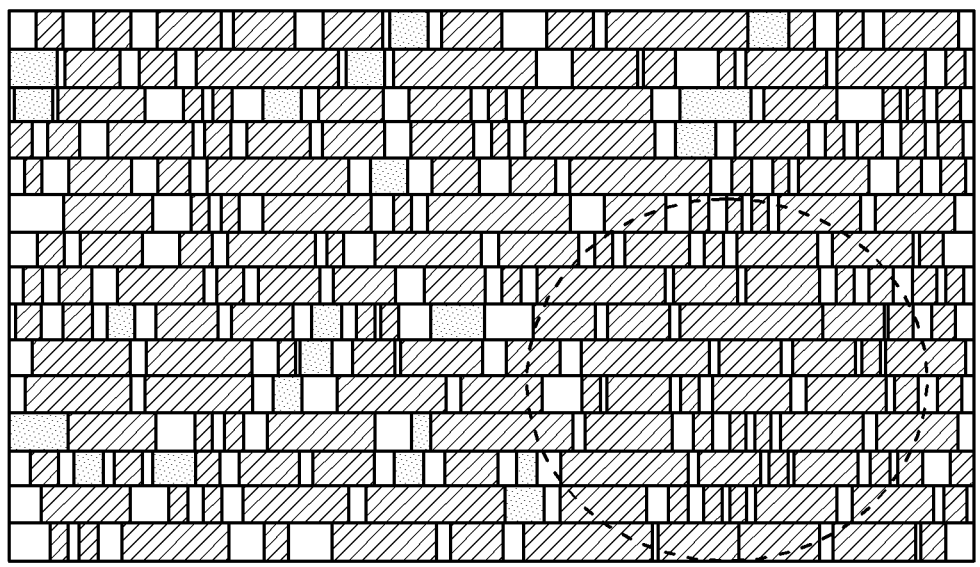
FIG. 1 is a schematic diagram illustrating an exemplary circuit layout which reserves some space for the DCAP in the prior art.
Figure 4:
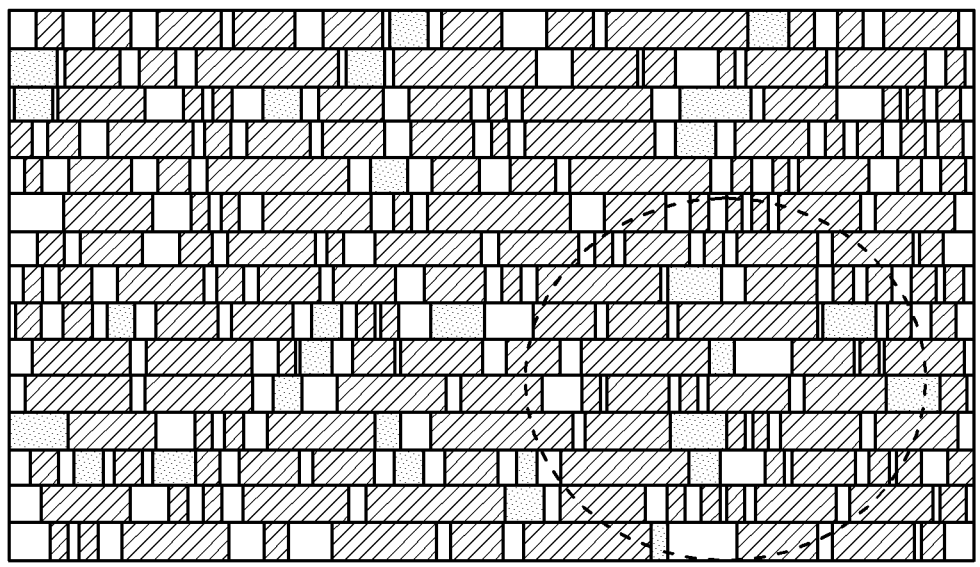
FIG. 4 is a schematic diagram of a circuit layout obtained based on FIG. 2.

Referring to FIG. 4, FIG. 4 is a schematic diagram of a circuit layout obtained based on FIG. 2. As compared to FIG. 1, the hotspots in the circled area in FIG. 4 comprise sufficient DCAP space, and there is no large unused area in the overall layout.

Figure 5:
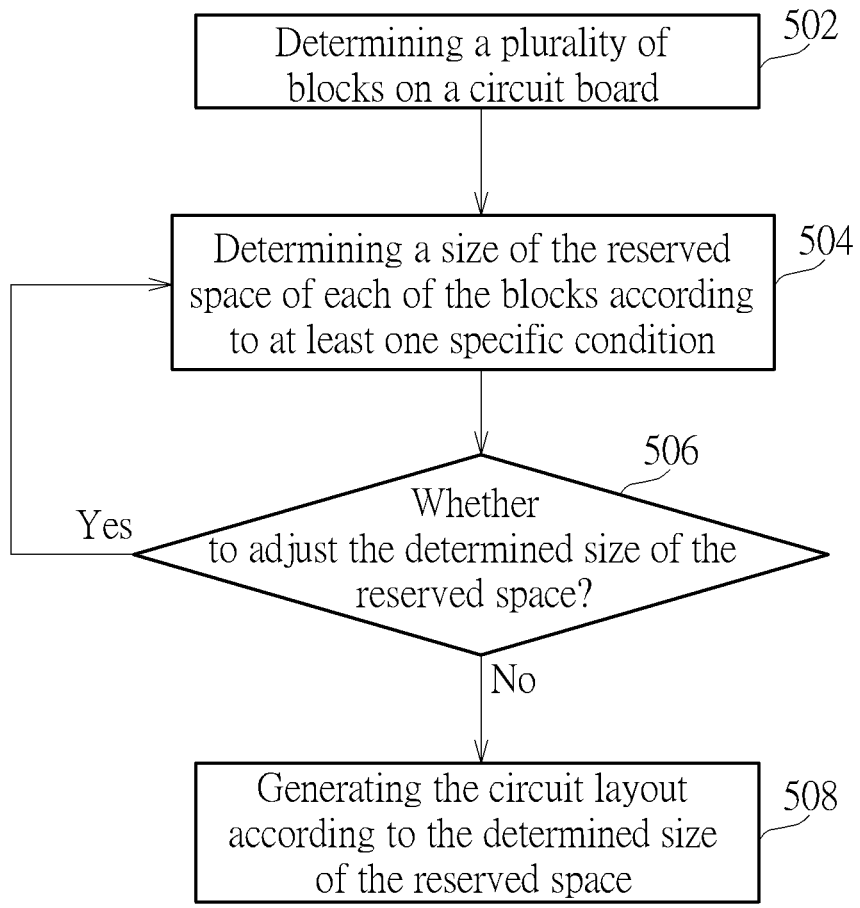
FIG. 5 is a method of using simulation software to generate circuit layout according to an embodiment of the invention.

Referring to FIG. 5, FIG. 5 is a method of using simulation software to generate circuit layout according to an embodiment of the invention. It should be noted that if substantially the same result can be obtained, these steps are not necessarily to be performed in accordance with the execution order as shown in FIG. 5. The steps shown in FIG. 5 and executed by the afore-mentioned processor can be summarized as follows:

502: determining or planning a plurality of blocks on a circuit board, wherein each block comprises an operating space and a reserved space;

504: determining a size of the reserved space of each of the blocks according to at least one specific condition;

506: determining whether to adjust the determined size of the reserved space according to at least one determining condition, if so, step 504 us returned, and if not, step 508 is entered;

508: generating the circuit layout according to the determined size of the reserved space of the blocks.

Since the person having ordinary skill in the art should be able to easily understand the details of each step in FIG. 5 after reading the above paragraphs, the details are omitted here for brevity.

In summary, by implementing the technical features in the present invention, the redundant circuit area on the circuit board can be properly used. In addition, since the present invention generates a corresponding circuit layout by using the software according to the toggle rate data sheet, the generation speed is extremely fast, and the space utilization is extremely accurate. No large area that cannot be used will be left and the placement of important electronic components will also not be sacrificed.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A method of using a simulation software to generate a circuit layout, the method comprising:
 (A) determining a plurality of blocks on a circuit board, wherein each block of the plurality of blocks comprises an operating space and a reserved space;
 (B) determining a size of the reserved space of each block of the plurality of blocks according to at least one specific condition;
 (C) determining whether to adjust the size of the reserved space determined in step (B) according to at least one determining condition; and
 (D) when it is determined not to adjust the size of the reserved space in step (C), generating the circuit layout according to the size of the reserved space of each block of the plurality of blocks determined in step (B).

2. The method of claim 1, further comprising:
 when it is determined to adjust the size of the reserved space in step (C), returning to step (A).

3. The method of claim 1, wherein the at least one specific condition comprises a plurality of toggle rates of the plurality of blocks.

4. The method of claim 3, wherein step (B) further comprises:
 sorting blocks of the plurality of blocks according to the plurality of toggle rates of the plurality of blocks, wherein the size of the reserved space is proportional to a toggle rate of a corresponding block of the plurality of blocks.

5. The method of claim 3, wherein the at least one specific condition further comprises whether blocks of the plurality of blocks are located in a hotspot or a distance between each block and a hotspot.

6. The method of claim 1, wherein the at least one specific condition comprises whether blocks of the plurality of blocks are located in a hotspot or a distance between each block and a hotspot.

7. The method of claim 1, wherein the at least one determining condition comprises whether a total area of the reserved spaces of the plurality of blocks exceeds a predefined value.

8. The method of claim 7, wherein the predefined value is a predefined percentage of a total area of the plurality of blocks, and the predefined percentage is 1%-3%.

9. The method of claim 7, wherein the at least one determining condition further comprises whether the size of the reserved space of the plurality of blocks determined in step (B) makes an overall dynamic IR drop to reach a predefined target.

10. The method of claim 9, wherein the predefined target is that the circuit layout is able to maintain a normal functioning state.

11. The method of claim 1, wherein the at least one determining condition comprises whether a total size of the reserved spaces of the plurality of blocks determined in step (B) makes an overall dynamic IR drop to reach a predefined target.

12. The method of claim 11, wherein the predefined target is that the circuit layout is able to maintain a normal functioning state.

13. The method of claim 1, wherein the reserved space of each block of the plurality of blocks is reserved for placing one or more capacitors.

14. A method of using a simulation software to generate a circuit layout, the method comprising:
 (A) providing a toggle rate of each area on a circuit board;
 (B) sorting blocks of a plurality of blocks on the circuit board and configuring a reserved space of each block of the plurality of blocks according to a toggle rate of a corresponding block of the plurality of blocks;
 (C) generating a candidate circuit layout according to a size of the reserved space of said each block;
 (D) determining whether a total area of the reserved spaces exceeds a predefined percentage of a total area of the plurality of blocks;
 (E) determining whether an overall dynamic IR drop reaches a predefined target when the total area of the reserved spaces does not exceed the predefined percentage of the total area of the plurality of blocks; and
 (F) generating the circuit layout according to the candidate circuit layout generated in step (C) when the overall dynamic IR drop reaches the predefined target.

15. The method of claim 14, further comprising:
 returning to step (B) when the total area of the reserved space exceeds the predefined percentage of the total area of the plurality of blocks.

16. The method of claim 14, further comprising:
 returning to step (B) when the overall dynamic IR drop does not reach the predefined target.

17. The method of claim 14, wherein the size of the reserved space is proportional to the toggle rate of the corresponding block.

18. The method of claim 14, wherein the reserved space of the plurality of blocks is reserved for placing one or more capacitors.

* * * * *